United States Patent [19]
Worley

[11] Patent Number: 6,016,268
[45] Date of Patent: Jan. 18, 2000

[54] THREE TRANSISTOR MULTI-STATE DYNAMIC MEMORY CELL FOR EMBEDDED CMOS LOGIC APPLICATIONS

[75] Inventor: Eugene Robert Worley, Irvine, Calif.

[73] Assignee: Richard Mann; a part interest

[21] Appl. No.: 09/019,186

[22] Filed: Feb. 5, 1998

Related U.S. Application Data

[60] Provisional application No. 60/038,095, Feb. 18, 1997.

[51] Int. Cl.[7] .................................................. G11C 11/24
[52] U.S. Cl. .......................................... 365/149; 365/187
[58] Field of Search ...................................... 365/149, 187

[56] References Cited

U.S. PATENT DOCUMENTS

| | | | |
|---|---|---|---|
| 4,803,664 | 2/1989 | Itoh | 365/210 |
| 4,935,896 | 6/1990 | Matsumura et al. | 365/187 |
| 4,989,055 | 1/1991 | Redwine | 257/302 |
| 5,283,761 | 2/1994 | Gillingham | 365/189.07 |
| 5,652,728 | 7/1997 | Hosotani et al. | 365/210 |
| 5,812,476 | 9/1998 | Segawa | 365/222 |

*Primary Examiner*—David Nelms
*Assistant Examiner*—Hoai V. Ho

[57] ABSTRACT

Methods are disclosed in making a multi-state dynamic memory using a three transistor cell. The cell construction is consistent with a logic semiconductor process and is therefore useful for embedded memory applications. Considerations are given to write levels, read levels, reference devices, and sense amplifier design. Two cell enhancements are proposed: substituting a PFET in place of and NFET for the write select transistor so that improved noise margin can be achieved and adding a capacitor for extended refresh times. Methods are also introduced to reduce select transistor leakage current during the deselected state.

15 Claims, 6 Drawing Sheets

THREE TRANSISTOR MULTI-STATE DYNAMIC MEMORY CELL FOR EMBEDDED CMOS LOGIC APPLICATIONS

This application claims benefit of provisional application Ser. No. 60/038,095, filed Feb. 18, 1997.

BACKGROUND OF THE INVENTION

1. Field of the Invention

This invention is directed to 3 transistor Dynamic Random Access Memories (DRAMs), in general, and to multi-state DRAMs in particular which are embedded in a standard CMOS logic process.

2. Prior Art

Figure 1A:
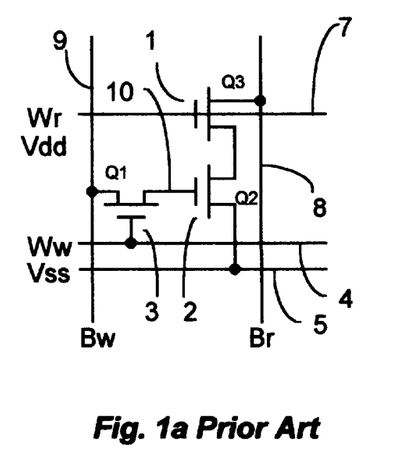
FIG. 1A is a schematic of a prior art 3 transistor dynamic memory cell with separate write and read bit lines.
Figure 1B:
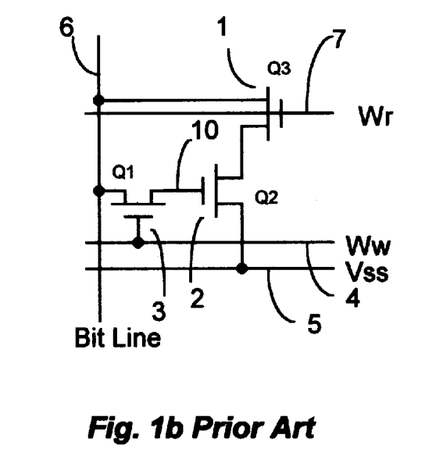
FIG. 1B is a schematic of a prior art 3 transistor dynamic memory cell with a common write and read bit line.

FIG. 1. shows a schematic diagram of a three transistor dynamic memory cell similar to the one used by Intel and others in the late sixties and early seventies for computer memories. Two versions are shown: one in which the write data line 9 and the read data line 8 are separate (FIG. 1a) and one in which these two cell ports are common 6 (FIG. 1b). The three transistor dynamic memory cell uses a transistor Q1 3 as a write select device, Q2 2 as the read out buffer transistor whose gate serves as the storage capacitor, and Q3 1 as the read select device. Q3 1 is turned on by placing the read word line 7 in the high state or at Vdd and the write select transistor 3 is turned on by placing write word line 4 in the high state or at Vdd. The storage node is the gate capacitance of Q2 2. Since the right hand junction of Q1 3 will have leakage current, the charge stored on Q2's gate will bleed off over time and, therefore, periodic reading and re-writing or refreshing of cell will have to performed before the stored logic state of the cell is lost.

The one transistor/capacitor dynamic memory cell eventually replaced the three transistor cell by the mid seventies largely because of the superior density of the latter. The three transistor memory cell has one advantage over the one transistor/capacitor cell in that the three transistor cell produces a stable output current when read. The one transistor/capacitor cell basically outputs a voltage which is severely attenuated by the bit line capacitance (the voltage on the capacitor is reduced by roughly a factor of ten when read). For this reason, three transistor DRAM cells are still used in limited applications where memory density is not a factor such as data buffers.

The stable current output provided by the three transistor during read makes the cell a better candidate for multi-state data storage over the one transistor/capacitor cell.

As mentioned earlier, one very significant reason the one transistor/capacitor dynamic cell has become dominant is that special processing steps can be applied to the storage capacitor to make the cell very dense. This high density is achievable since the capacitor is readily amenable to vertical construction techniques unlike MOSFETs. Currently, stacked polysilicon layers or polysilicon blocks are used to make the capacitor which is placed over the select transistor or, alternatively, deep trench capacitors are used. Unfortunately, the process steps needed to make a compact dynamic memory cell are not compatible with logic processes. Generally speaking, dynamic RAM processes have one layer of metal and several layers of polysilicon whereas logic processes have one polysilicon layer and several metal layers. Thus, to add a one transistor/capacitor dynamic memory to a logic process requires the addition of several layers which drives up the chip cost considerably. It is only recently that chip companies have tried to "embed" dynamic memory cells into a logic chip. The chief driving force is the need for large, high data "bandwidth" memories in such applications as graphics processors. High data bandwidth can be achieved by using words with a large number of bits without having to worry about high pin counts as is the case when the memory and processor are separate chips.

SUMMARY OF THE INSTANT INVENTION

It is highly desirable to have a high bit density memory which can be realized in a standard logic CMOS process. This can be achieved using the 3 transistor dynamic memory cell in conjunction with multi-state storage. The stable current output provided by the three transistor during read makes the cell a better candidate for multi-state data storage over the one transistor/capacitor cell. Thus, it is an object of this invention to develop the concept of a multi-state three transistor cell in order to significantly improve the memory cell density of a chip fabricated in a standard logic CMOS process. It is another object of the invention to replace the NFET write select transistor used in prior art with a PFET transistor which produces a wider dynamic voltage range on the storage node and has better immunity from substrate noise and Single Event Upset. It is yet another object of the invention to include storage capacitor construction techniques to extend refresh times and improve multi-state readability of the 3 transistor dynamic memory cell.

DESCRIPTION OF THE PREFERRED EMBODIMENT

Figure 2A:
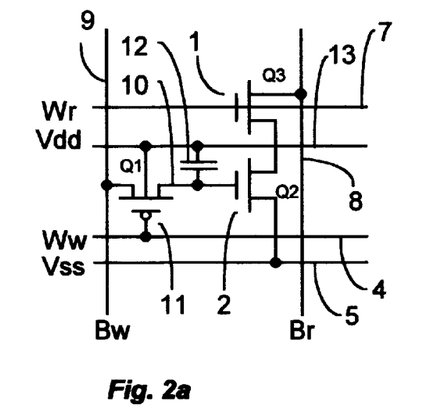
FIG. 2A is a schematic of a 3 transistor dynamic memory cell with separate write and read bit lines and a PFET write select transistor.
Figure 2B:
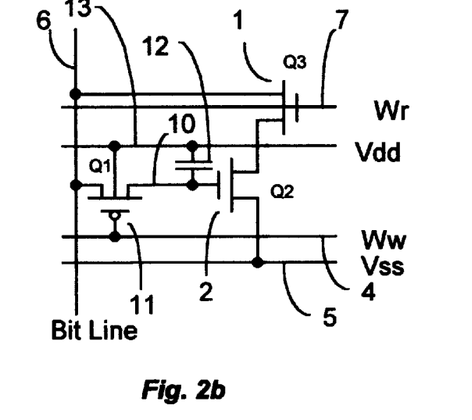
FIG. 2B is a schematic of a 3 transistor dynamic memory cell with a common write and read bit line and a PFET write select transistor.

FIG. 2 shows a diagram of the preferred embodiment. Added to the cell is an optional storage node capacitor 12 which can extend the refresh time, especially for multi-state memory cells. The FIG. 2 cells are similar to that of FIG. 1 except that Q1 11 is a PFET instead of an NFET 3. Although an NFET write select transistor 3 can save some area by not requiring a Vdd body node line 13 as does the PFET and can be placed closer to the other NFETs, 1 & 2, there are a number of reasons in selecting a PFET for this device. They are:

1. Single Event Upset (SEU) Tolerance

In typical logic CMOS processes a P type substrate is used thus making N+ junctions of NFETs good collectors of charge generated by a particle strike which creates the charge in the form of hole-electron pairs in the substrate. The N well construction of the PFET, however, means that most SEU generated charge gets collected by the well-substrate junction and not by the P+ well junction of the PFET which would disturb the charge used for storage.

2. Substrate Noise and Minority Carriers Induced from the Switching Activity of Digital Circuits The switching activity of digital circuits which accompany embedded memories induce a considerable amount of noise into the P type substrate which is commonly used for logic processes. NFETs, through junction capacitive coupling to substrate and the body effect, are responsive to this noise and are less suitable candidates for the write transistor select function which must place a predicable amount of charge onto the storage node since one of NFETs junctions is connected to the storage node. Also, switching NFETs can inject minority carriers into the P substrate via the impact ionization mechanism. These carriers are collected by the N+/substrate junctions of surrounding NFETs and by N wells of PFETs. The P+/Well junctions of PFETs, however, do not collect these carriers which can disturb the charge placed on the storage node of the DRAM cells.

3. Higher Output Signal Range

Another reason for selecting a PFET as the write select device is the higher voltage range that can be applied to the storage node 10. Referring to FIG. 1, with an NFET write select transistor, the maximum voltage that can be applied to the storage node 10 is Vdd-Vtn where Vtn is the NFET threshold which includes a body effect. Furthermore, as the node 10 approaches Vdd-Vtn the charging rate decreases substantially thus further reducing the practical voltage range that can be applied to the storage node 10. With the PFET write select transistor as shown in FIG. 2, the storage node can be completely charged to Vdd.

4. Adjustable Vt

Since the well potential is adjustable, the relative Vt of the PFET can also be adjusted for increased dynamic signal range. This will be discussed in more detail later.

5. Shallow Trench Isolation

Shallow Trench Isolation (STI) is being used for process technologies at 0.25 micron and lower. STI allows an NFET and a PFET to be placed at dimensions equal to that of transistors of like polarity. Thus, the area penalty is not present when using a PFET write select device in an STI technology.

In FIG. 2A the write and read bit lines are separate. The write voltage is presented on the bit line Bw 9. When the write word line 4 goes from the unselected state which is Vdd to the selected state which is 0V, Q1 becomes conductive thereby causing the storage node 10 to charge to the voltage of Bw 9. To read the cell, the read word line 7 goes from the unselected state which is 0V to the selected state which is Vdd. This causes the read select transistor I to turn on allowing the conduction state of the read buffer transistor, Q3, to be sensed via the read bit line Br 8.

FIG. 2B is a more compact version of FIG. 2A. Here, the write bit line and the read bit line have combined into one bit line 6. The only operating difference is that the cell in FIG. 2b can not use a feedback circuit between the write and read nodes (i.e. Bw and Br) during the write operation in order to precisely set the read current to some reference value. The feedback feature between the write and read lines can be useful in a multi-state memory for setting the storage node voltage to values which accurately correspond to different read reference currents.

Figure 3:
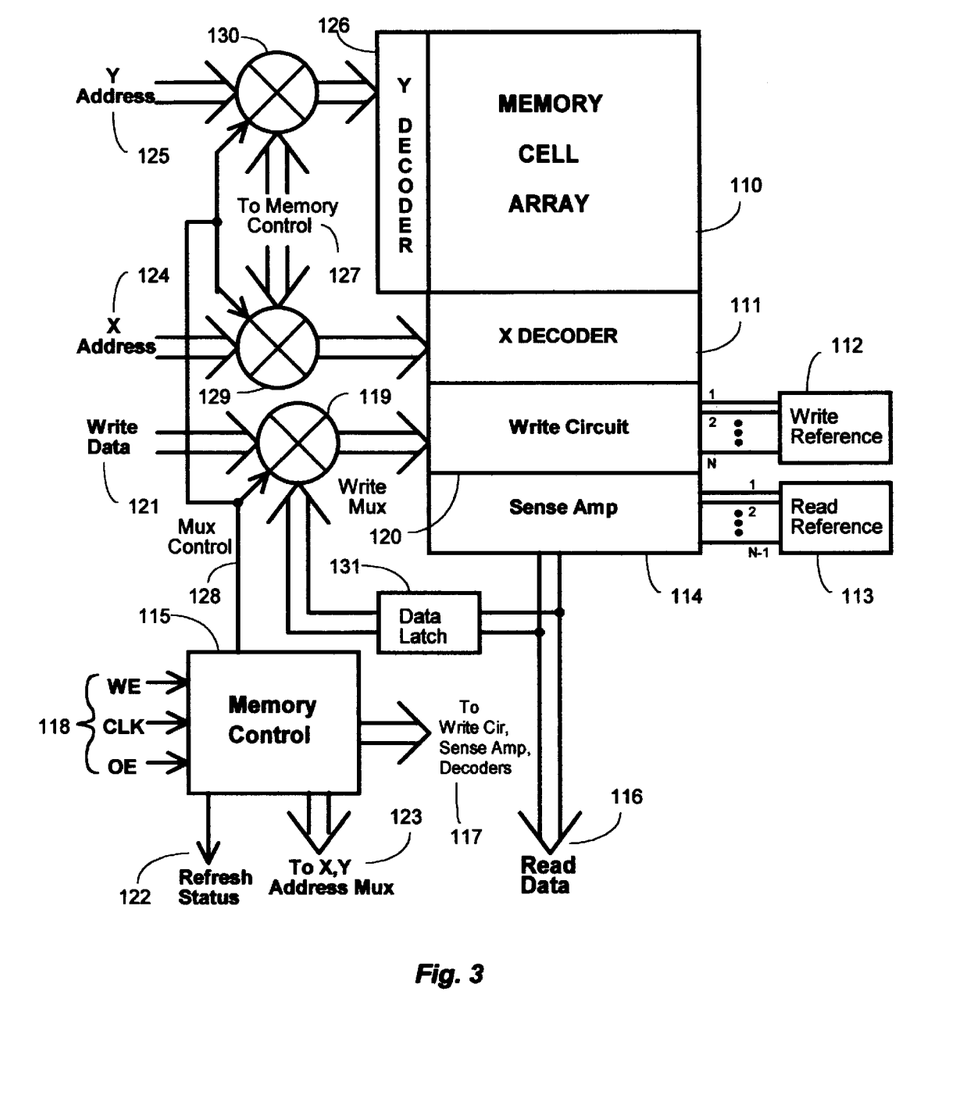
FIG. 3 is a block diagram of a multi-state dynamic memory using the 3 transistor cell and a read mode which directly uses the write reference signal.

FIG. 3 shows a block diagram of a multi-state dynamic memory using the three transistor cell of FIG. 2B. The Y address data 125 is used to select either a write word line or a read word line via the Y decoder 126. The Y address data is multiplexed with address data generated by the Memory Control 115. The X address data 124 is used to select the column of cells to be accessed. The selected columns are connected either to the Write Circuit 120 or the Sense Amplifier 114 for reading depending on whether the memory is in the write or read modes, respectively. The X address data 124 is multiplexed 129 with address data generated by the Memory Control 115. To minimized refresh time, the word size read out should be as large as possible with an upper limit of one row of cells.

The Write Reference 112 provides the various signal levels that can be written into the memory cell which is required for a multi-state memory. To write the cell the bits to be placed into the cell must be translated into one of the analog reference levels by a write data multiplexer. The Read Reference provides the reference signal levels required to read the multiple levels of the memory cell in order to create a corresponding logic state. As will be shown later, for N signal levels there will be N write reference levels and N−1 read reference levels. For M bits stored in one cell the number of write signal levels is given by $$N=2^M \tag{1}$$

Control signals 118 to the memory include clock (CLK) if the memory is synchronous, WE or write enable signal, and OE or output enable signal for controlling the tri-state feature of the data output driver. The Memory Control 115 is used to sequence the memory operation and includes a timer for determining when the memory requires refreshing. When it is determined that the memory array needs to be refreshed the Mux Control signal enables the X and Y address data 127 to be input from the Memory Control which will sequence through addresses. Once an address is established by the Memory Control 115 data 116 is read from the array. The read data 116 is then stored in the data latch 131 by the Memory Control and then the latched data is re-written into the array. After refreshing the Memory Control returns the memory back to external read/write status. During refresh a Refresh Status signal 122 is provided to the processor so that the process can suspend memory access.

It should be noted that there are a number of different ways refreshing can be accomplished to facilitate a given architecture. The example provided above assumes that memory access is totally random. In a system where the memory access is sequential or partially sequential refreshing can be performed on a memory block when access is occurring in a different memory block so that the refresh cycle does not adversely affect data access time.

Figure 4A:
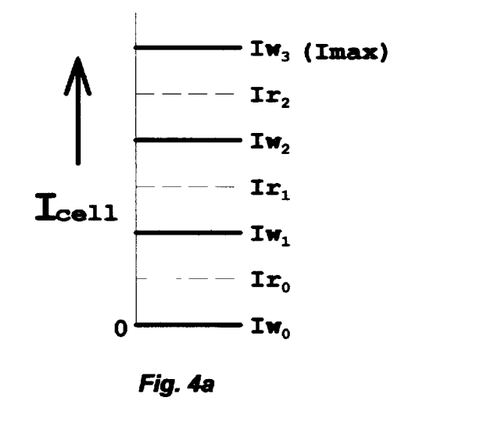
FIG. 4A shows equally spaced read and write current levels for 2 bit, 4 state sensing.
Figure 4B:
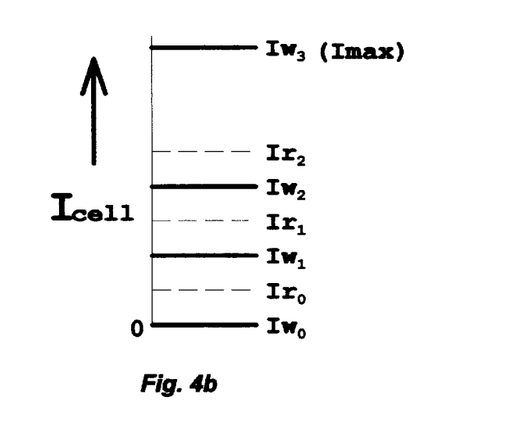
FIG. 4B shows non-equally spaced read and write current levels for 2 bit, 4 state sensing which takes into account variations in Vdd.

FIGS. 4a and 4b shows an example of the write current levels and the read current levels required for storage of 2 bits per cell. The highest write state, $Iw_3$, is typically the maximum current output by the cell or Imax. This current is realized by simply placing Vdd on the storage node 10 of FIG. 2. The lowest reference current, $Iw_0$, is 0. This current is realized by placing any voltage from Vss or 0V to about Vtn on the storage node 10. The other two write current reference levels are placed between these bounding levels. One would normally expect that the reference levels would be uniformly spaced as shown in FIG. 4a. However, if levels $Iw_1$ and $Iw_2$ and the read levels are generated by a stable reference source such as a band gap reference, then the spacing between $Iw_3$ and $Iw_2$ would be greater as shown in FIG. 4b so that fluctuations in Vdd do not reduce the sensing margin between the write currents and the read currents.

Note that the read reference levels are placed in between the write levels in FIGS. 4a and 4b. It can be seen from the figures that for M bits of storage there are $2^M$ read reference levels and $2^M-1$ write reference levels.

Figure 5:
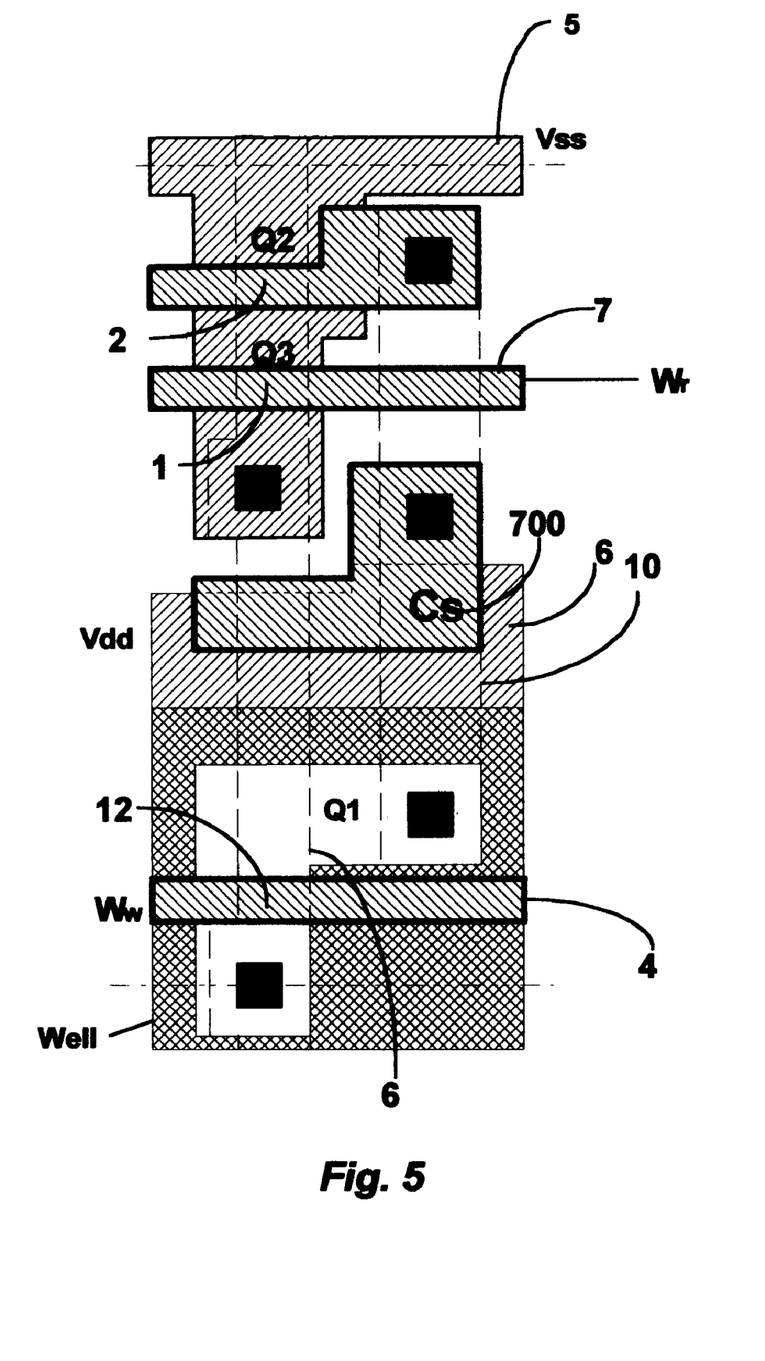
FIG. 5 shows an example of the layout of the three transistor dynamic memory cell.

FIG. 5 shows an example of a three transistor dynamic memory cell which corresponds to FIG. 2B. It is about 60% the size of a six transistor static memory cell laid out in a pure logic process. The source line 5 which supplies ground or Vss to the cell is in N+ diffusion and the Vdd line 6 which supplies Q1's substrate is also in N+ diffusion. A P channel capacitor 700, Cs, has been added to the storage node to increase capacitance. It should be noted that Metal 1 is typically used for the bit lines 6 while Metal 2 (not shown) is used to strap the word lines ($W_w$ and $W_r$), Vss, and Vdd. If Metal 3 and Metal 4 are present then with the addition of a masking step another capacitor can be added to the storage node. This is realized by using Metal 3 as the ground plate and Metal 4 as the storage node plate. A thin dielectric (about 350 A for a 3.3V process) is placed between the plates to increase capacitance. Metal 3 is used as the ground plate to shield the storage node plate (Metal 4) from the underlying noisy conductors.

Figure 6A:
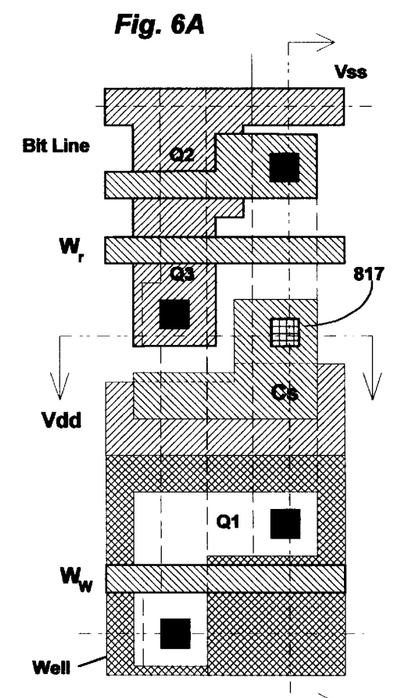
FIG. 6A shows the plan view of the cell of FIG. 5 with a metal-oxide-metal capacitor added to the storage node in order to extend the refresh time.
Figure 6B:
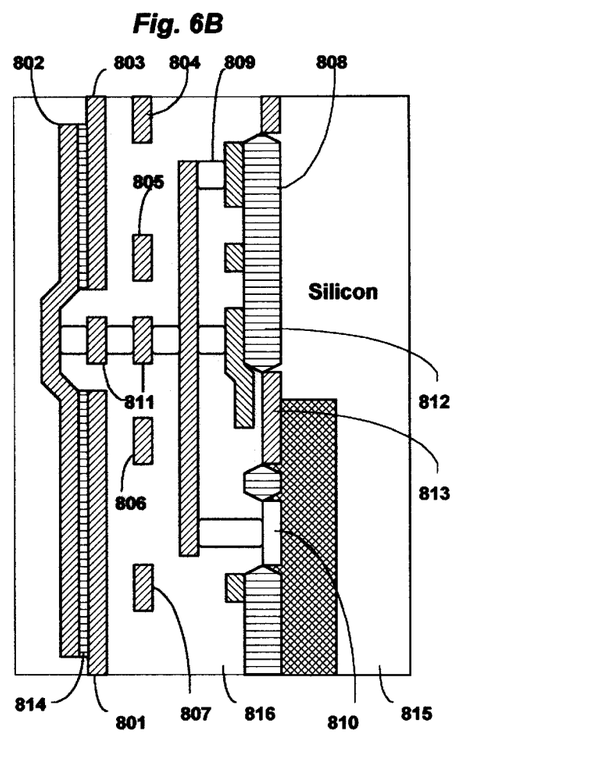
FIGS. 6B and 6C show cross sectional views taken along 8B—8B and 8C—8C of FIG. 8A, respectively.
Figure 6C:
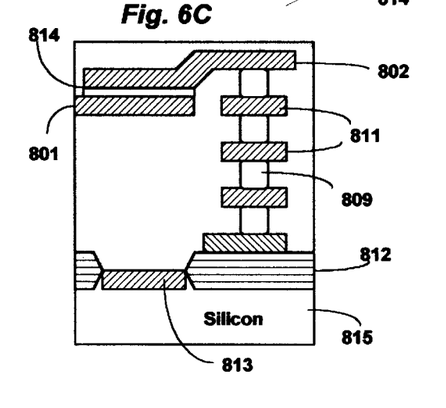

FIG. 6 shows a layout diagram of the cell of FIG. 5 which includes 4 levels of metal. Typically, 3 or more metal layers require Chemical-Mechanical-Polishing (CMP) and tungsten plugs 809 in order to get the necessary planarity as shown in FIG. 6b and FIG. 6c. Metal layer #1 is used for the bit line 6 of FIG. 2B. Metal layer #2 is used for strapping lines running horizontally. Metal #2 line 804 straps the source or Vss diffusion, line 805 straps Wr, line 806 straps the Vdd diffusion, and line 807 straps Ww. Metal layer #3 is used as a ground plate 801 for the storage capacitor and Metal layer #4 as the signal plate 802 for the storage capacitor. A thin oxide 814 which is about 350 A thick for a 3.3V process using oxide can be used as the capacitor dielectric. It should be noted that any suitable dielectric can be used including nitride, ONO, NO, etc. The signal storage plate 802 is contacted to the storage node 818 via metal layer #1 and metal layer #2 811 and associated tungsten plugs. Symbol 817 represents the contact and stacked via's.

The storage capacitor of FIG. 6 requires 2 additional masking steps. One mask is used to remove the thick interleave dielectric that normally exists between metal layer #3 and metal layer #4. Note that at the contact site 819 of the signal plate of the capacitor the thick oxide remains. Then a thin layer (~350 A) of oxide is deposited. Another masking step is required to remove the thin oxide over the top of tungsten contact plug 819. It should be noted that the ground and signal plate can be inverted so that metal layer #4 is the ground plate and metal layer #3 is the signal or storage plate. This capacitor configuration is a little more area efficient since it is not necessary to make a pass through hole in the ground plate. However, as mentioned earlier, in this configuration the storage plate will pick up some noise from the underlying nodes. Thus, the selection of the plate configuration depends on design trade offs between layout efficiency and noise.

Figure 7:
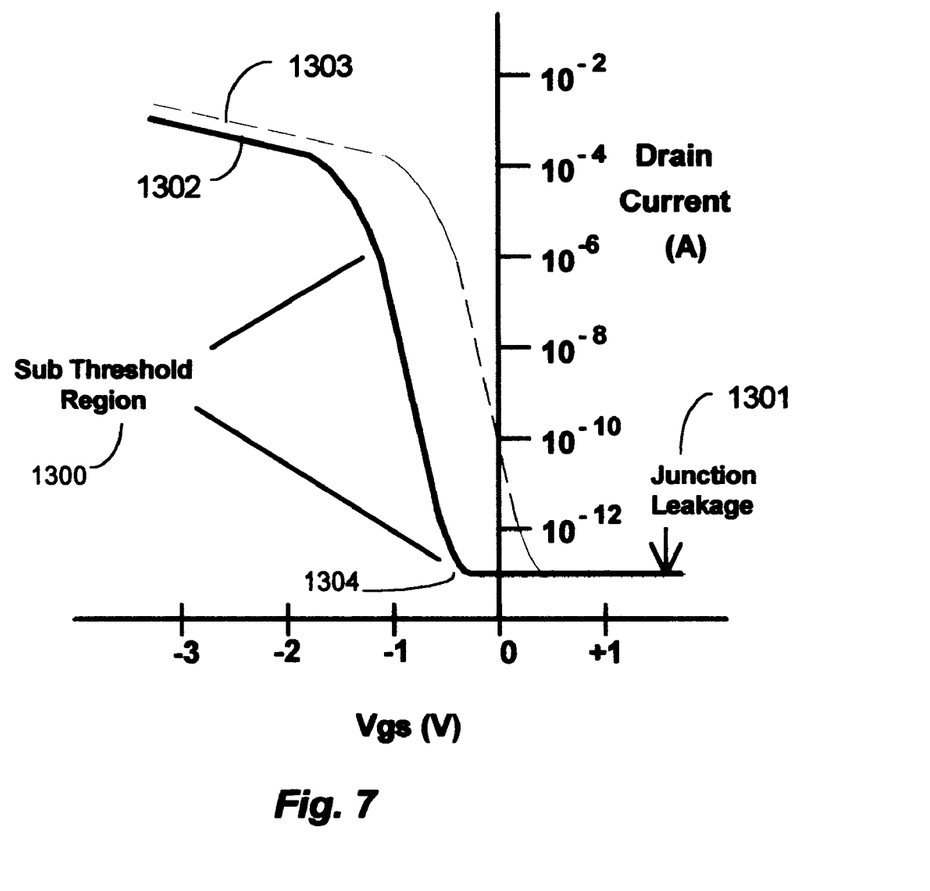
FIG. 7 shows the log Ids versus Vgs curve for a PFET with a high and a low threshold voltage.

FIG. 7 shows a plot of the log of drain current (Ids) versus gate to source voltage (Vgs) for a PFET for some negative drain bias. Looking at curve 1302 there are three distinct regions: the strong inversion region or "on" state region which shows a gradually sloped curve for gate to source voltages less than about −1.2V. The linear region of the Log(Ids) versus Vgs curve is the weak inversion region or so called sub-threshold slope region 1300. Finally, at high value of Vgs the curve flattens out. In this region the current is determined by thermally generated junction leakage current and is typically less than 0.1 pA for a small transistor.

Ideally, the nee 1304 of the curve 1302 which is at the transition point of the sub-threshold region and the junction leakage region should lie at or to the left of Vgs=0 so that when the word line voltage is at Vdd the leakage is at the lowest possible current. In logic processes, however, this condition is not always present. Curve 1303 shows a case in which the nee is to the right of the 0 axis. At Vgs=0 this example curve 1303 shows a leakage current of about $10^{-10}$ A whereas for the example curve 1302 the leakage is about $10^{-13}$ A.

There are two ways the minimum off state leakage can realized. One is to have the highest bit line voltage less than Vdd so that when the word line voltage is at Vdd a positive gate to source voltage is present which is large enough to guarantee maximum shutoff over the process variation of the PFET parameters. This condition, unfortunately, lowers the voltage range that can be applied to the storage node. The other possibility is to raise the well or body voltage, 13 of FIG. 2, to a voltage slightly more positive than Vdd thereby decreasing the threshold voltage (or increasing the magnitude). Since the well or body current of a PFET is essentially space charge generation current which is small, a charge pump can then be used to generate this voltage. Thus, a circuit can be devised to monitor the PFET threshold voltage using a sample transistor and adjust the threshold voltage magnitude by using the well or body bias. Also, if a storage capacitor is coupled to the well node then signal ground must also be a consideration in the design of the well bias generator.

What is claimed is:

1. A semiconductor memory cell comprising a plurality of 3 transistor dynamic memory cells arranged in one ore more columns for storing data, one bit line for writing data and one bit line for reading data stored in the cell, a plurality of word row select lines for writing data and a plurality of word row select lines for reading data, a writing means which can place from one to several different levels into said cell for the purpose of storing one or more bits per cell, a reading means which can read levels of said memory cell and output a digital word corresponding to said levels, and a refresh means which can read said cell and re-write the read data back into said cell; wherein said three transistor memory cell comprises a first transistor of P type whose gate is tied to the write word line, whose drain/source is connected to the write bit line, and whose other drain/source node is connected to a storage node comprising a transistor gate of a second transistor and a capacitor, the second transistor being of N type whose gate is connected to the storage node, whose drain/source node is connected to ground or Vss and whose other drain/source is connected to a drain/source of a third transistor, the third transistor of N type whose gate is connected to the read word select line, whose drain/source is connected to the drain/source of the second transistor, and whose other drain/source is connected to the read bit line.

2. The semiconductor memory device according to claim 1 wherein said storage levels that can be written to a given cell occur at equally spaced current levels and are established by a write reference generator circuit.

3. The semiconductor memory device according to claim 2 wherein read reference levels which are used for establishing the data value of the stored level are in between the write levels.

4. The semiconductor memory device according to claim 2 wherein write storage levels are written into said cell using feedback between the read bit line and the write bit line to adjust the cell's bit line current to be equal to that of a reference.

5. The semiconductor memory device according to claim 2 further comprising a write data multiplexer used to select a write reference level corresponding to data cell bits for writing into an appropriately addressed cell.

6. The semiconductor memory device according to claim 1 wherein a method of extending refresh time is implemented by adding more capacitance to the storage node with such a capacitor being constructed of a lower level of metal from a multi-level process and with a thin deposited insulator being placed between such metal levels, with one metal electrode being connected to Vdd or Vss and the other being connected to the storage node.

7. The semiconductor memory device according to claim 1 wherein a method of extending retention time is achieved by operating a body voltage of the first transistor of P type, wherein the first transistor of P type is a PFET word line write select transistor, at a level higher than Vdd or power rail so that magnitude of effective threshold voltage of the write select transistor is high enough to prevent weak inversion leakage from dominating parasitic discharge of storage node capacitance when the write word line is in a deselected state or at Vdd.

8. The semiconductor memory device according to claim 1 wherein a method of extending retention time is achieved by operating the write word line at a level higher than Vdd or power rail so that the difference between gate voltage and source voltage of the first transistor of P type, wherein the first transistor of P type is a PFET word line write select transistor, is high enough to prevent weak inversion leakage of the first transistor from dominating parasitic discharge of storage node capacitance when the write word line is in a deselected state.

9. The semiconductor memory cell comprising a plurality of 3 transistor dynamic memory cells arranged in at least one column for storing data, one common bit line for both writing and reading, a plurality of word row select lines for writing data and a plurality of word row select lines for reading data, a writing means which can place one or more different levels into said cell for the purpose of storing 1 or more bits per cell, a reading means which can read levels of said memory cell and output a digital word corresponding to said levels, and a refresh means which can read said cell re-write data back into said cell; wherein said three transistor semiconductor memory cell comprises a first transistor of P type whose gate is tied to the write word line, whose drain/source is connected to the common write/read bit line, and whose other drain/source is connected to a storage node comprising a transistor gate of a second transistor and a capacitor, the second transistor being of N type whose gate is connected to the storage node, whose drain/source is connected to ground or Vss and whose other drain/source is connected a drain/source of a third transistor, the third transistor of N type whose gate is connected to the read word select line, whose drain/source is connected to the drain/source of the second transistor, and whose other drain/source is connected to the common write/read bit line.

10. The semiconductor memory device according to claim 9 wherein said storage levels that can be written to a given cell occur at equally spaced current levels and are established by a write reference generator circuit.

11. The semiconductor memory device according to claim 9 wherein read reference levels are used for establishing the data value of the stored level and the read reference levels are in between the write levels.

12. The semiconductor memory device according to claim 10 further comprising a write data multiplexer used to select a write reference level corresponding to cell data bits for writing into an appropriately addressed cell.

13. The semiconductor memory device according to claim 10 wherein a method of extending refresh time is implemented by adding more capacitance to the storage node with such a capacitor being constructed of a lower level of metal from a multi-level process and with a thin deposited insulator being placed between such metal levels, with one metal electrode being connected to Vdd or Vss and the other being connected to the storage node.

14. The semiconductor memory device according to claim 9 wherein a method of extending retention time is achieved by operating a body voltage of the first transistor of P type, wherein the first transistor of P type is a PFET word line write select transistor, at a level higher than Vdd or power rail so that magnitude of effective threshold voltage of the write select transistor is high enough to prevent weak inversion leakage from dominating parasitic discharge of storage node capacitance when the write word line is in a deselected state or at Vdd.

15. The semiconductor memory device according to claim 9 wherein a method of extending retention time is achieved by operating the write word line at a level higher than Vdd or power rail so that the difference between gate voltage and source voltage of the first transistor of P type, wherein the first transistor of P type is a PFET word line write select transistor, is high enough to prevent weak inversion leakage of the first transistor from dominating parasitic discharge of storage node capacitance when the write word line is in a deselected state.

* * * * *